United States Patent
Teller et al.

(10) Patent No.: US 9,025,111 B2
(45) Date of Patent: May 5, 2015

(54) SEAMLESS DISPLAY PANEL USING FIBER OPTIC CARPET

(75) Inventors: Eric Teller, Palo Alto, CA (US); Johnny Lee, Mountain View, CA (US)

(73) Assignee: Google Inc., Mountain View, CA (US)

(*) Notice: Subject to any disclaimer, the term of this patent is extended or adjusted under 35 U.S.C. 154(b) by 250 days.

(21) Appl. No.: 13/599,444

(22) Filed: Aug. 30, 2012

(65) Prior Publication Data

US 2013/0278872 A1 Oct. 24, 2013

Related U.S. Application Data

(60) Provisional application No. 61/636,458, filed on Apr. 20, 2012.

(51) Int. Cl.
| | | |
|---|---|---|
| *G02F 1/1335* | (2006.01) | |
| *G02F 1/133* | (2006.01) | |
| *G02F 1/13* | (2006.01) | |
| *G02B 3/00* | (2006.01) | |
| *G02B 6/06* | (2006.01) | |

(52) U.S. Cl.
CPC ............ *G02B 3/0037* (2013.01); *G02B 3/0043* (2013.01); *G02B 3/0056* (2013.01); *G02B 6/06* (2013.01)

(58) Field of Classification Search
CPC ............................ G02F 1/1335; H04N 9/3197
USPC ........ 349/5–9, 11, 1, 73–74, 96–98, 104–105
See application file for complete search history.

(56) References Cited

U.S. PATENT DOCUMENTS

| | | | |
|---|---|---|---|
| 4,183,630 A * | 1/1980 | Funada et al. ................ 349/159 |
| 5,877,492 A | 3/1999 | Fujieda et al. | |
| 6,195,016 B1 * | 2/2001 | Shankle et al. ............... 345/102 |
| 6,224,213 B1 * | 5/2001 | Kobayashi .................... 351/212 |
| 6,337,724 B1 * | 1/2002 | Itoh et al. ........................ 349/75 |
| 6,885,010 B1 | 4/2005 | Traynor et al. | |
| 7,071,614 B2 | 7/2006 | Anandan et al. | |

(Continued)

FOREIGN PATENT DOCUMENTS

| | | |
|---|---|---|
| CN | 102150099 A | 8/2011 |
| JP | 2008-309963 A | 12/2008 |

(Continued)

OTHER PUBLICATIONS

PCT/US2013/030026; International Search Report and Written Opinion of the International Searching Authority, mailed Jan. 16, 2014, 16 pages.
PCT/US2013/030026; International Preliminary Report on Patentability, mailed Oct. 30, 2014, 13 pages.

(Continued)

*Primary Examiner* — Dung Nguyen
(74) *Attorney, Agent, or Firm* — Blakely Sokoloff Taylor & Zafman LLP

(57) ABSTRACT

A display panel for use with a multi-panel display includes an array of display pixels to emit pixel light. A fiber bundle including an array of fibers is disposed over the array of display pixels. The fiber bundle includes a first end of the array of fibers rigidly fixed adjacent to the array of display pixels and optically aligned with the array of display pixels and a loose fiber portion that permits a second end of the array of fibers opposite the first end to slump-over and move. The fiber bundle receives the pixel light emitted from the array of display pixels into the first end of the array of fibers and emits the pixel light out the second end of the array of fibers.

21 Claims, 8 Drawing Sheets

(56) References Cited

U.S. PATENT DOCUMENTS

| | | |
|---|---|---|
| 7,202,602 B2 | 4/2007 | Anandan |
| 7,498,743 B2 | 3/2009 | Anandan |
| 7,515,800 B2 * | 4/2009 | Reichel et al. ................ 385/120 |
| 7,663,312 B2 | 2/2010 | Anandan |
| 7,742,120 B2 * | 6/2010 | Bayley et al. ................... 349/58 |
| 7,934,862 B2 | 5/2011 | Anandan |
| 7,935,963 B2 | 5/2011 | Anandan |

FOREIGN PATENT DOCUMENTS

| | | |
|---|---|---|
| JP | 2009-098239 A | 5/2009 |
| KR | 10-2011-0008486 A | 1/2011 |
| TW | 201028828 A | 8/2010 |

OTHER PUBLICATIONS

TW102111248—Taiwan Office Action and Search Report with English translation mailed Nov. 13, 2014, 21 pages.

* cited by examiner

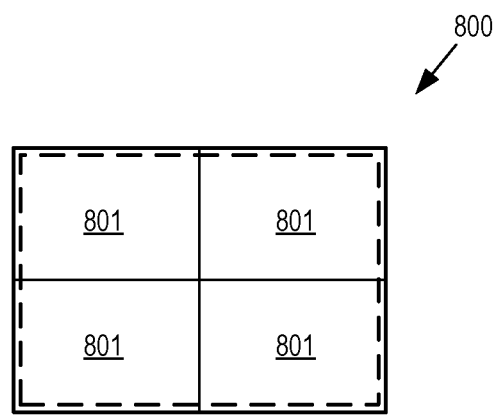
FIG. 8A
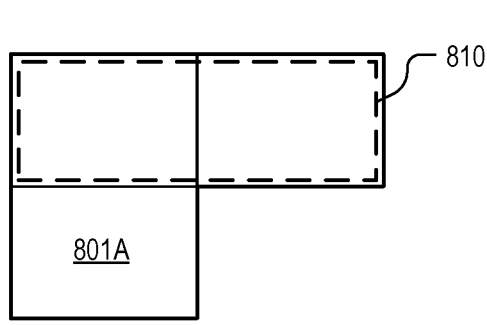 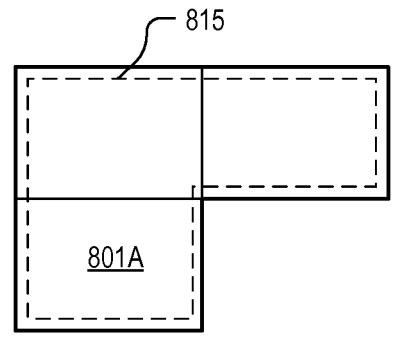
FIG. 8B     FIG. 8C

SEAMLESS DISPLAY PANEL USING FIBER OPTIC CARPET

CROSS-REFERENCE TO RELATED APPLICATIONS

This application claims the benefit of U.S. Provisional Application No. 61/636,458 filed on Apr. 20, 2012, the contents of which are incorporated herein by reference.

TECHNICAL FIELD

This disclosure relates generally to displays, and in particular but not exclusively, relates to tiling displays.

BACKGROUND INFORMATION

Large wall displays can be prohibitively expensive as the cost to manufacture display panels rises exponentially with display area. This exponential rise in cost arises from the increased complexity of large monolithic displays, the decrease in yields associated with large displays (a greater number of components must be defect free for large displays), and increased shipping, delivery, and setup costs. Tiling smaller display panels to form larger multi-panel displays can help reduce many of the costs associated with large monolithic displays.

FIGS. 1A and 1B illustrate how tiling multiple smaller, less expensive display panels 100 together can achieve a large multi-panel display 105, which may be used as a large wall display. The individual images displayed by each display panel 100 may constitute a sub-portion of the larger overall composite image collectively displayed by multi-panel display 105. While multi-panel display 105 can reduce costs, visually it has a major drawback. Each display panel 100, includes a bezel 110 around its periphery. Bezel 110 is a mechanical structure that houses pixel region 115 in which the display pixels are disposed. In recent years, manufactures have reduced the thickness of bezel 110 considerably to less than 2 mm. However, even these thin bezel trims are still very noticeable to the naked eye, distract the viewer, and otherwise detract from the overall visual experience.

Various other approaches for obtaining seamless displays include display lensing, blended projection, stackable display cubes, and LED tiles. Display lensing places a single contiguous lens in front of each display panel 100 to present a fused borderless image in a particular "sweet spot." However, the viewing angle is relative narrow and image distortion along continuous lines still occurs. Blended projection uses software stitching and mechanical mounting of traditional projection screens. Currently, blended projection uses relatively low cost hardware and is a good option for non-planar surfaces. However, there are significant physical constraints on usage and installation and requires regular maintenance and sophisticated calibration. Stackable display cubes are a rear projection technology. Each display cube is relative deep and the seams between adjacent cubes are easily visible. LED tiles are arrays of discrete RGB light emitting diodes ("LED"). LED tiles can have virtually invisible seams, since the seams run between pixels. However, LED tiles are expensive and have large pixel pitches (e.g., 2 to 4 mm) resulting in low resolution images.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

FIGS. 8A-8C illustrate techniques for implementing intelligent reformatting/reconfiguration of a display image when an individual display tile is added to or removed from a multi-panel display, in accordance with an embodiment of the disclosure.

DETAILED DESCRIPTION

Embodiments of an apparatus and method for seamless display panel tiling using intentional pixel randomization via a fiber optic carpet display are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
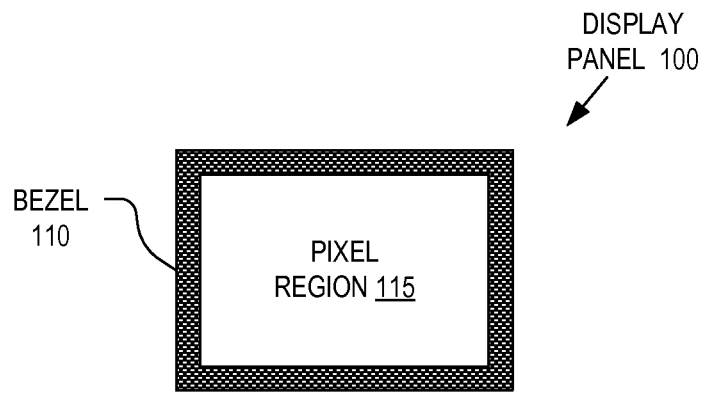
FIGS. 1A & 1B (PRIOR ART) illustrate conventional display panel tiling.
Figure 1B:
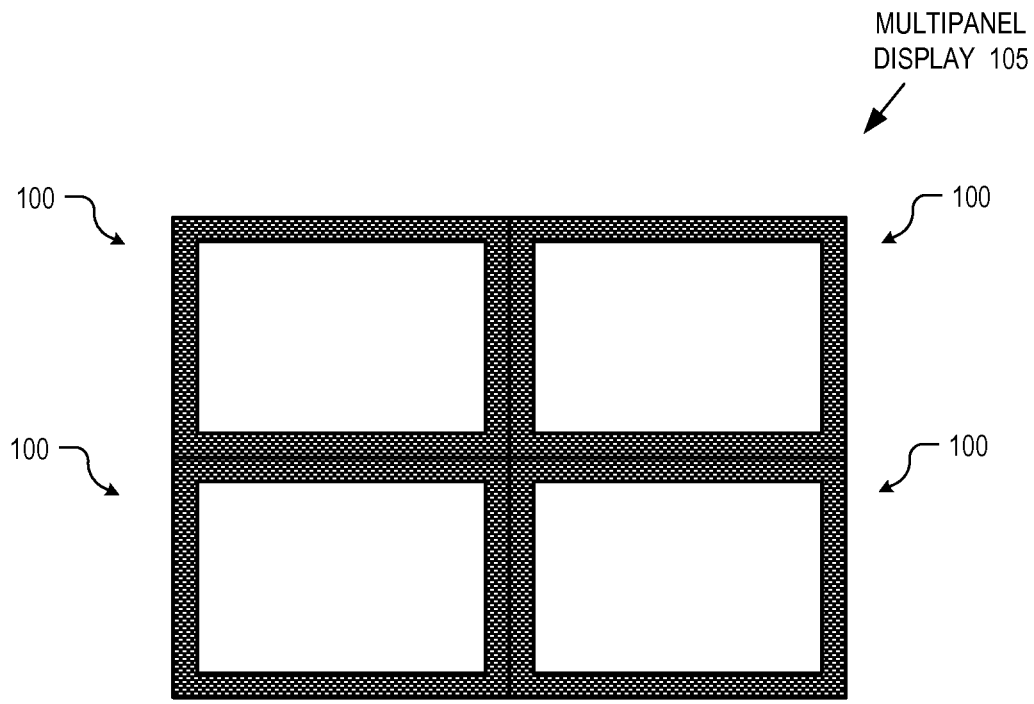
Figure 2A:
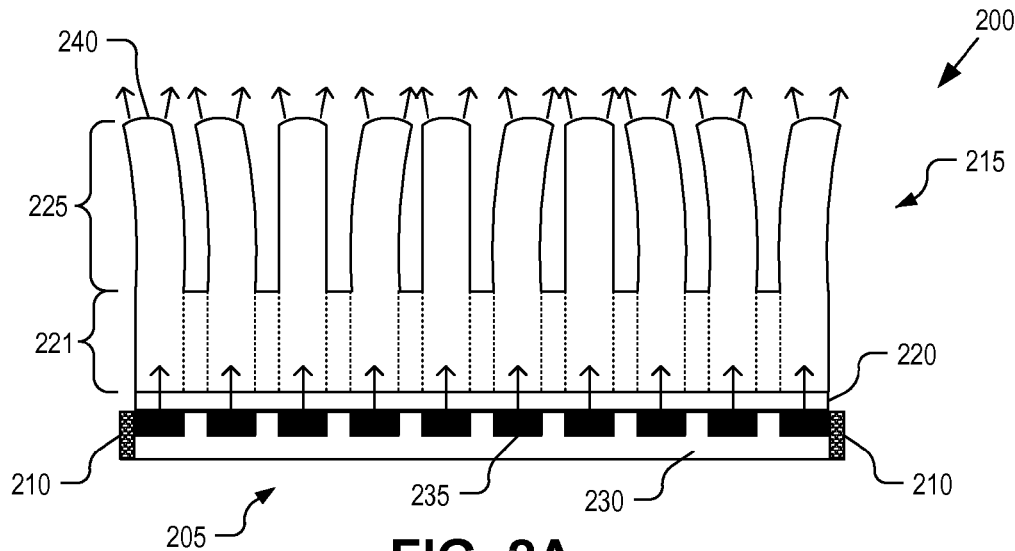
FIGS. 2A-2C illustrate an apparatus for seamless display panel tiling using intentional pixel randomization via a fiber optic carpet display, in accordance with an embodiment of the disclosure.
Figure 2B:
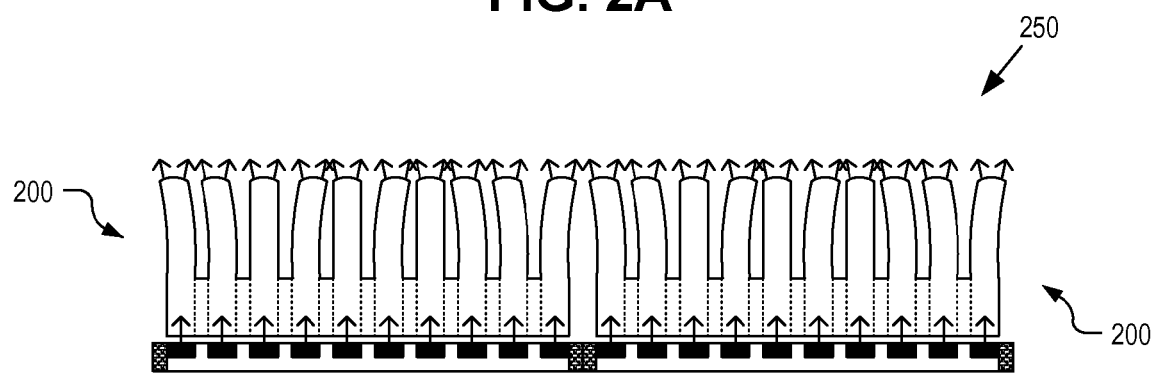
Figure 2C:
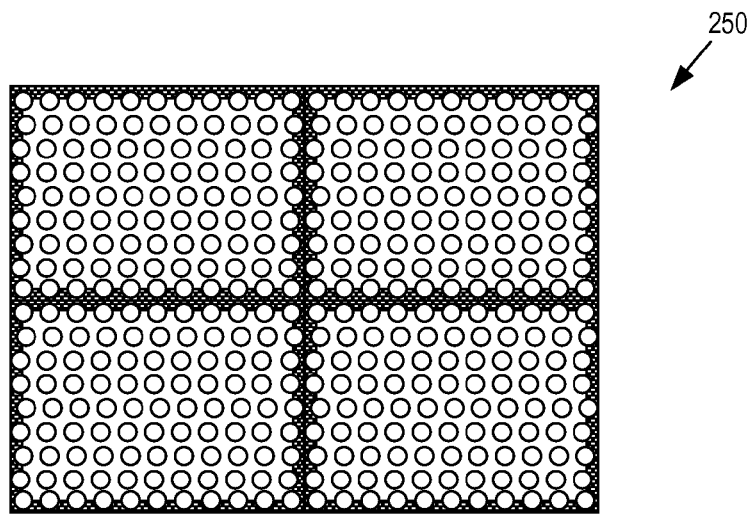

FIGS. 2A-2C illustrate an apparatus for seamless display panel tiling using intentional pixel randomization via a fiber optic carpet display, in accordance with an embodiment of the disclosure. FIG. 2A is a cross-sectional view of a display panel 200. The illustrated embodiment of display panel 200 includes pixel region 205 surrounded by a bezel 210, a fiber bundle 215, and interconnecting optics 220. Fiber bundle 215 includes a fused fiber portion 221 and a loose fiber portion 225. The illustrated embodiment of pixel region 205 includes a substrate 230 having an array of display pixels 235 disposed in or on the substrate.

In the illustrated embodiment, fiber bundle 215 includes a one-to-one correspondence of fibers to underlying display pixels 235. Each fiber is optically aligned to receive pixel light emitted by a corresponding display pixel 235 and to emit the pixel light as an image pixel out the top of the fiber. Fused fiber portion 221 provides a rigid portion having a fiber pitch that is engineered to match the pixel pitch between display pixels 235.

Interconnecting optics 220 facilitates the optical coupling between fiber bundle 215 and display pixels 235. In one embodiment, interconnecting optics 220 includes an anti-reflective ("AR") coating and fuses or glues the two components together. In some embodiments, interconnecting optics 320 includes an array of microlenses that correspond on a one-to-one basis with display pixels 235 and fibers of fiber bundle 215 to focus the pixel light emitted from display pixels 235 into the individual fibers. In the illustrated embodiment, each fiber of fiber bundle 215 further includes a divergence lens 240 formed into the emission end. Divergence lens 240 increases the divergence of pixel light emitted from each fiber, thereby increasing the field of view of display panel 200. Divergence lens 240 may be a curved emission surface fabricated by annealing the ends of each fiber. Alternatively, divergence lenses 240 may be gradient index ("GRIN") lenses fabricated by chemically treating the end of each fiber.

Instances of display panel 200 may be tiled together to form a larger multi-panel display 250 (see FIGS. 2B and 2C). Multi-panel display 250 is seamless or near-seamless at the physical interconnects between adjacent panels 200. To reduce or virtually eliminate the seam between adjacent display panels 200, a technique of intentional pixel randomization by design is used. Pixel randomization operates to reduce regular patterns, which the eye tends to easily identify, with irregular patterns. Display panels 200 achieve this randomization by permitting a small amount of fiber slump-over along the length of loose fiber portion 225. Loose fiber portion 225 may be viewed as a sort of fiber optic display carpet and the fiber slump results in a sort of blooming effect. The degree of slump can be controlled by selecting the height (e.g., 0.5 mm to 3 mm or otherwise) of loose fiber portion 225. When two display panels 200 are abutted in multi-panel display 250 (see FIGS. 2B and 2C), the blooming causes fibers along the seam to intermesh by slumping over bezel 210, thereby concealing the inter-panel seam and bezel 210. Not only do the fibers physically slump over and conceal bezel 210, but the intermeshing of the perimeter fibers is random in nature, like the seam between two pieces of identical carpet that are directly abutting each other. The random intermeshing creates an irregular pattern at the interconnection, thereby further concealing the seam.

The random slump-over of loose fiber portion 225 can introduce image discontinuities along the inter-panel seam and in the interior portion of pixel region 205. Accordingly, in one embodiment, these discontinuities are remedied via appropriate feedback control and pixel remapping (discussed in greater detail in connection with FIG. 9).

In some embodiments, to improve image contrast, the outer jackets of each fiber in loose fiber portion 225 (along with any inter-fiber gaps) may be coated with a dark (e.g., black) paint, a light absorbing paint, or the surface otherwise treated/darkened to reduce ambient reflections and improve black levels. In one embodiment, the fibers may be coated with a different index of refraction material that can guide/reflect ambient light away from the likely viewing angles from which a viewer would watch display panel 200. Additionally, interconnecting optics 220 may be engineered with difference refractive index materials to trap or block ambient light that travels down the fibers to prevent reflections back up fibers in fiber bundle 215, while promoting the coupling of display light from the pixel array into fiber bundle 215 (discussed in greater detail in connection with FIG. 4.

Substrate 230 may support a variety of different display pixel technologies. For example, display pixels 235 and substrate 230 may represent a liquid crystal display ("LCD"), a plasma display, a light emitting diode ("LED") display, a quantum dot array display, an organic LED ("OLED") display, an electro-luminescence display, or otherwise.

Figure 3A:
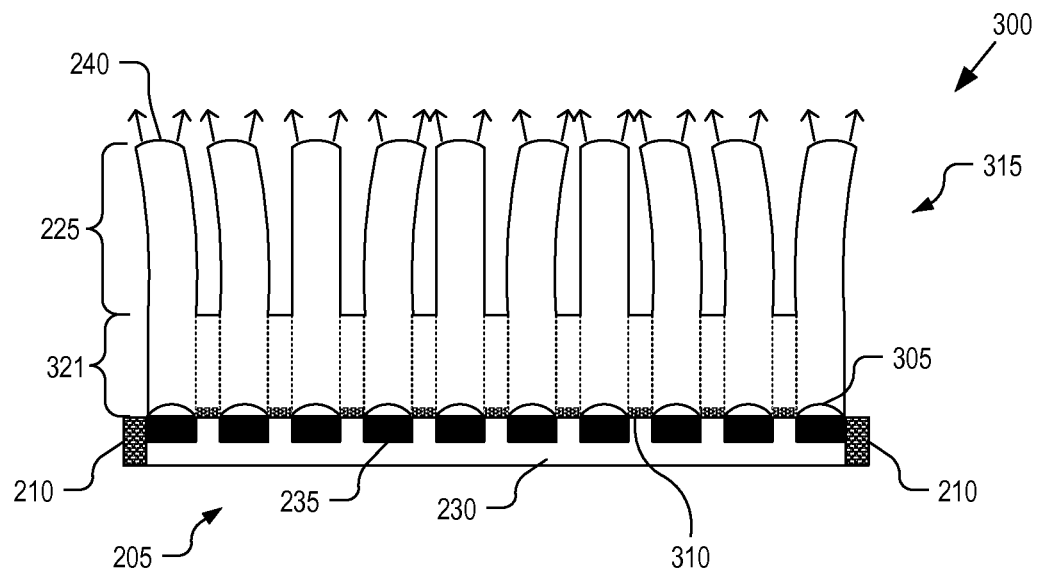
FIGS. 3A & 3B illustrate a fiber optic carpet display having lenses and cross-talk trenches formed into a bottom side of the fiber bundle, in accordance with an embodiment of the disclosure.
Figure 3B:
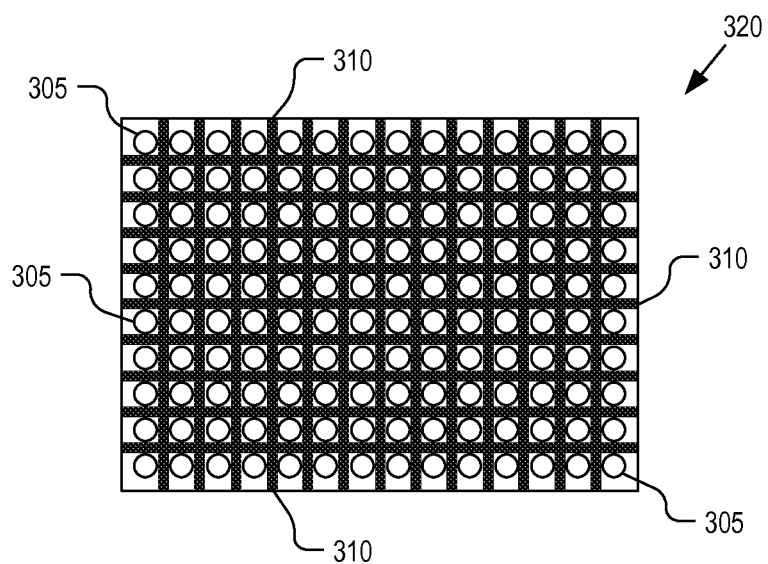

FIGS. 3A & 3B illustrate a fiber optic carpet display 300 including additional optical elements for reducing cross-talk and improving optical coupling between fiber bundle 315 and display pixels 235, in accordance with an embodiment of the disclosure. Fiber optic carpet display 300 is similar to display panel 200 with the following exceptions. Fiber optic carpet display 300 includes micro lenses 305 and cross-talk trenches 310 formed into a bottom side 320 (see FIG. 3B) of the fiber bundle 315. Although interconnecting optics 220 are not illustrated in FIG. 3A, in some embodiments, one or more layers of interconnecting optics 220 may also be included. For example, an AR layer, a polarizing layer, a polarization rotating layer, etc. may be disposed between substrate 230 and fused fiber portion 321.

Micro lenses 305 and/or cross-talk trenches 310 are formed into bottom side 320 of fused fiber portion 321. In one embodiment, physical shapes of these optical elements are etched into bottom side 320 and then optical material applied thereto. In the case of micro lenses 305, an AR coating or other engineered refractive index material (e.g., dichroic material, thin film filter, etc) is conformally or non-conformally applied to concave or convex surfaces formed in optical alignment with the bottom end of each fiber. Micro lenses 305 serve to collect pixel light emitted from display pixels 235 and focus this collected light into the bottom sides of each fiber of fiber bundle 315. In one embodiment, micro lenses 305 are fabricated on a one-to-one basis with the fibers and each is positioned beneath a fiber in optical alignment with a corresponding image pixel 235.

Cross-talk trenches 310 are etched into bottom side 320 of fused fiber bundle 321. The illustrated embodiment of cross-talk trenches 310 surround the fiber ends in a grid pattern and serve to optically isolate adjacent display pixels 235 and reduce optical cross-talk noise. Cross-talk trenches 310 may be filled with a dark or matte light absorbing material to absorb stray light rays. Cross-talk trenches 310 not only inhibit pixel light emitted from one display pixel 235 from being collected by an adjacent fiber, but can also reduce ambient light that travels backwards down one fiber from reflecting off substrate 230 into an adjacent fiber.

Figure 4:
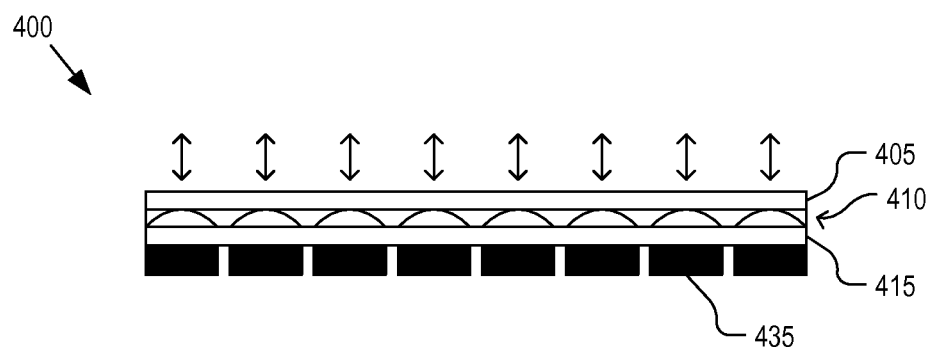
FIG. 4 illustrates an interconnecting optics layer including a circular polarizer and microlenses, in accordance with an embodiment of the disclosure.

FIG. 4 illustrates interconnecting optics 400, in accordance with an embodiment of the disclosure. Interconnecting optics 400 represent one possible implementation of interconnecting optics 220 illustrated in FIG. 2A. The illustrated embodiment of interconnecting optics 400 includes a circular polarizing layer 405, micro lenses 410, and an anti-reflective ("AR") layer 415 all disposed over display pixels 435. Circular polarizing layer 405 may be implemented as a quarter-wave plate retarder. Display pixels 435 may be implemented as an OLED display, which is often combined with a circular polarizer to block reflected light. If display pixels 435 are implemented using other display technologies that do not use a circular polarizer, then a circular polarizer or quarter-wave plate retarder may be positioned above display pixels 435 to block reflected light. During operation, ambient light that travels backwards down the fiber bundle 215 is circularly polarized by circular polarizing layer 405, which once reflected off of display pixels 435 the handedness of the circular polarization of the light is reversed from left to right or right to left, and blocked by circular polarizing layer 405 along the reverse path before being collected into fiber bundle 215. Thus, the illustrated embodiment of interconnecting optics 400 servers to reduce back reflections and improve image contrast. Of course, the order of micro lenses 410 and circular polarizing layer 405 may be switched in other embodiments not illustrated.

Figure 5:
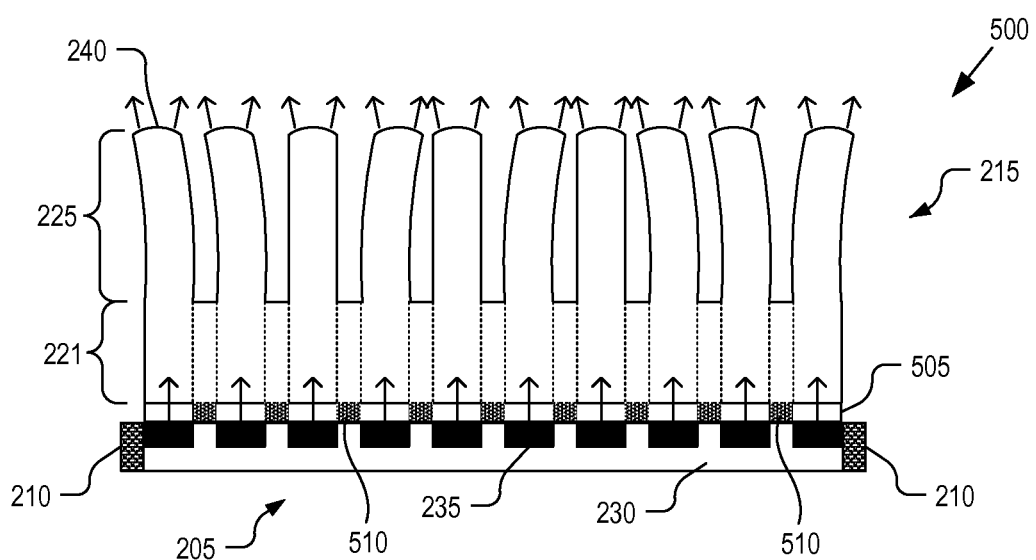
FIG. 5 illustrates an interconnecting optics layer including cross-talk blocks to optically isolate adjacent display pixels, in accordance with an embodiment of the disclosure.

FIG. 5 illustrates a display panel 500 including an interconnecting optics layer 505 having cross-talk blocks 510 disposed therein to optically isolate adjacent display pixels 235, in accordance with an embodiment of the disclosure. Interconnecting optics layer 505 may be formed of a clear or transparent material (e.g., polymer) that has been pattered to form a grid of cross-talk blocks 510. Cross-talk blocks 510 are formed of dark light absorbing or matte opaque material. The grid of cross-talk blocks 510 may be similar to the grid of cross-talk trenches 310 illustrated in FIG. 3B and serves a similar purpose. However, cross-talk blocks 510 are disposed in a distinct material layer between fused fiber portion 221 and display pixels 235.

Figure 6A:
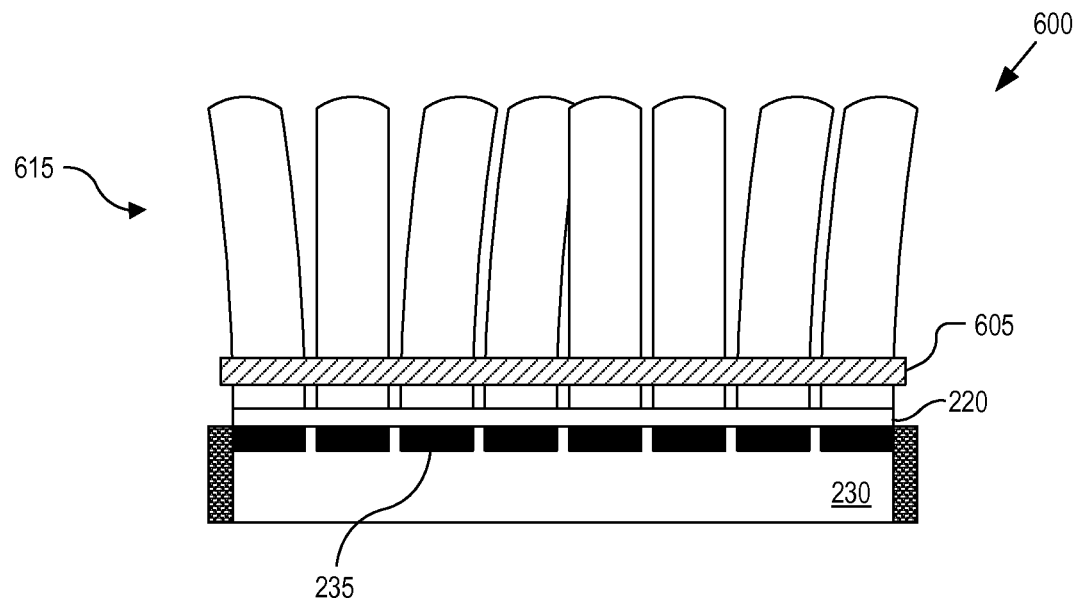
FIG. 6A illustrates a fiber optic carpet display using a binding member to hold a fiber bundle together, in accordance with an embodiment of the disclosure.
Figure 6B:
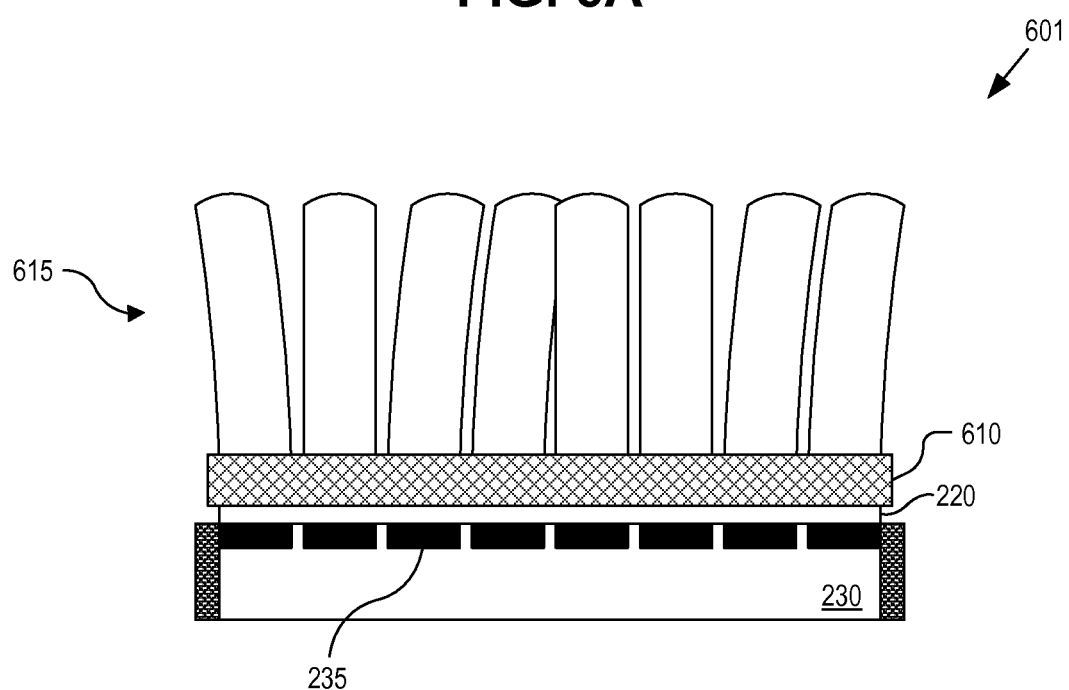
FIG. 6B illustrates a fiber optic carpet display using a mold to hold a fiber bundle together, in accordance with an embodiment of the disclosure.

In other embodiments, fused fiber portion 221 may be omitted; rather, loose fiber portion 225 extends down to interconnection optics layer 220. In these embodiments, the bottom side of loose fiber portion 225 may be held in place and optically aligned to the array of display pixels 235 via a fusing to interconnection optics 220, via a mechanical strapping around the bottom side of the fiber bundle (FIG. 6A), via a surrounding mold (FIG. 6B), or otherwise. For example, FIG. 6A illustrates a fiber optic carpet display 600 using a binding member 605 to hold a fiber bundle 615 together. Binding member 605 may be tension strap, a rigid bracket, or otherwise. FIG. 6B illustrates a fiber optic carpet display 601 using a mold 610 to hold fiber bundle 615 together. Mold 610 is a rigid member that includes a hole pattern in which fiber bundle 615 passes and is held in place. Mold 610 may include a pitch and pattern that matches the pitch and pattern of display pixels 235. In other embodiments, there may be a many-to-one correspondence of fibers to display pixels 235, in which case mold 610 would have a finer pitch than display pixels 235.

Figure 7A:
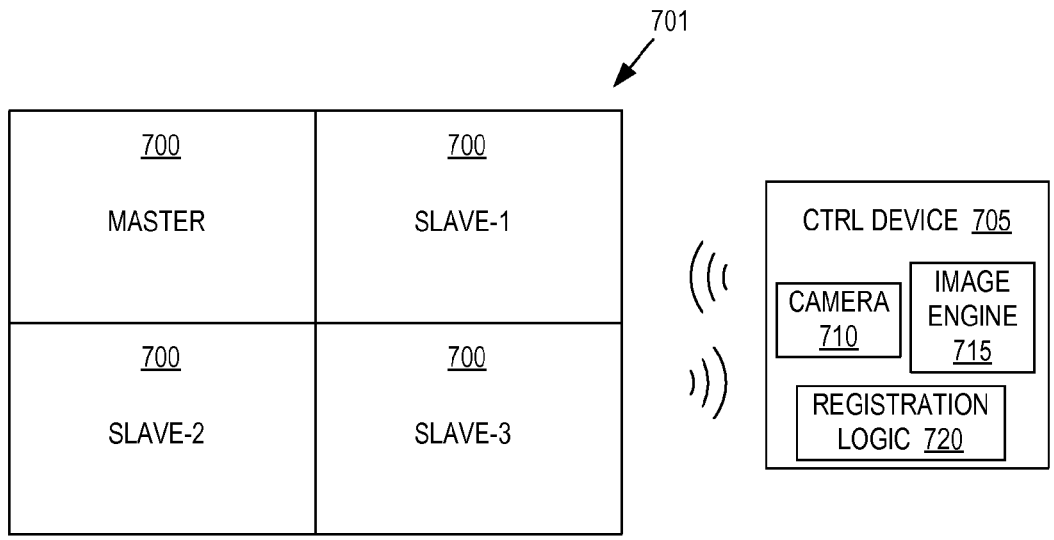
FIGS. 7A & 7B illustrate various communication protocols for displaying a composite image across multiple tiles of a multi-panel display, in accordance with an embodiment of the disclosure.
Figure 7B:
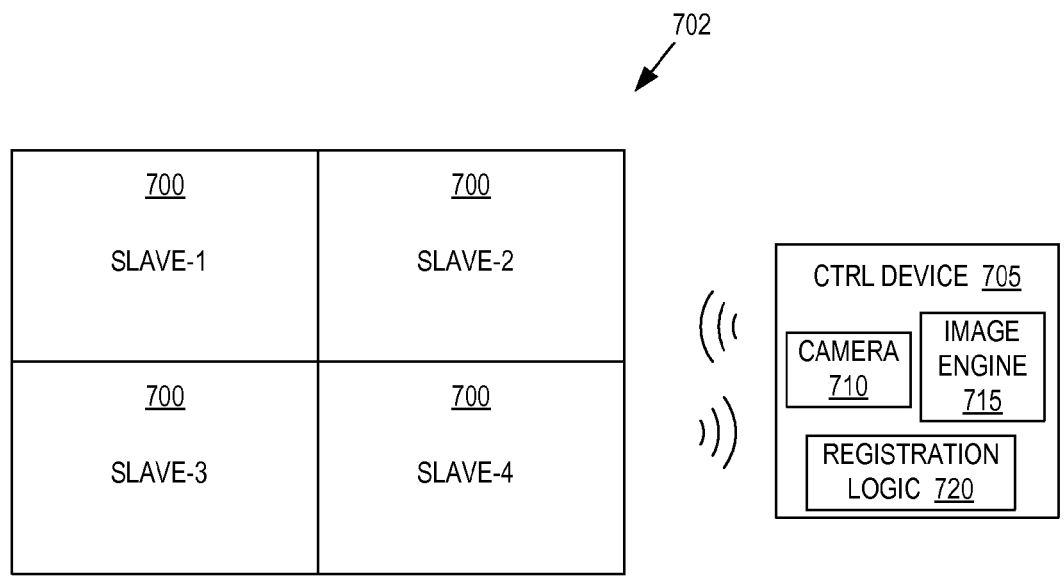

FIGS. 7A & 7B illustrate various communication protocols for displaying a composite image across multiple tiles of a multi-panel display 701, in accordance with an embodiment of the disclosure. Each display panel 700 may be implemented with any of display panels 200, 300, 500, 600, 601, or any combination thereof. FIG. 7A illustrates a technique where one of the display panels 700 operates as a master and the remaining display panels 700 operate as slaves that communicate with the master. The master device may be identical to the other slave devices, but merely designated as a master during operation. For example, the master device may be the first display panel 700 logically added to the multi-panel display 701. As new display panels 700 are added or existing display panels 700 removed, the master display panel 700 may be responsible tracking and assigning display statuses and roles. In another embodiment, the master device may include additional interface electronics (e.g., wireless transceiver) not included in the other slave display panels 700 for communicating with a control device 705. The control device 705 may communicate display images and control information with the master display panel 700, which then relays the appropriate portions of the display images to the respective slave display panels 700. FIG. 7B illustrates a more distributed protocol where all display panels 700 are identical and operate as slave devices controlled directly by control device 705. Various registration markers may be used to identify and distinguish the various display panels 700. For example, magnetic bits, RFID, optical markers, active links, or various bus interfaces and signaling protocols may be used.

The illustrated embodiment of control device 705 includes a camera 710, an image engine 715, and registration logic 720. In one embodiment, control device 705 may be implemented with a smart phone having a general purpose processor, a built in camera, and wireless interface electronics (e.g., WiFi or Bluetooth transceivers). The wireless interface electronics may be used to stream the composite image to display panels 700. Operation of control device 705 to setup and configure multi-panel displays 701 or 702 is discussed in further detail in connection with FIG. 9.

FIGS. 8A-8C illustrate techniques for implementing intelligent reformatting/reconfiguration of a display image when an individual display tile is added or removed from a multi-panel display 800, in accordance with an embodiment of the disclosure. Each display panel 801 may be implemented with any of display panels 200, 300, 500, 600, 601, or any combination thereof. When panels are added to or removed from multi-panel display 800, the remaining display panels 801 may be intelligently reconfigured to effectively use the resulting display area. Intelligent reconfiguration may include adjusting image resolution or switching between a complex display interface for large composite display areas and a simplified display interface for small composite displays (i.e., when the display area rises above or drops below a threshold size).

FIGS. 8B and 8C illustrate configuration options when the addition or removal of a display panel 801 results in an irregular shaped display area. In FIG. 8B, the display panel 801A forming the irregular shape is unused and the display image reverts to the largest available rectangular shaped area 810. In FIG. 8C, display panel 801A is used and the display image follows the irregular shaped area 815.

Figure 9:
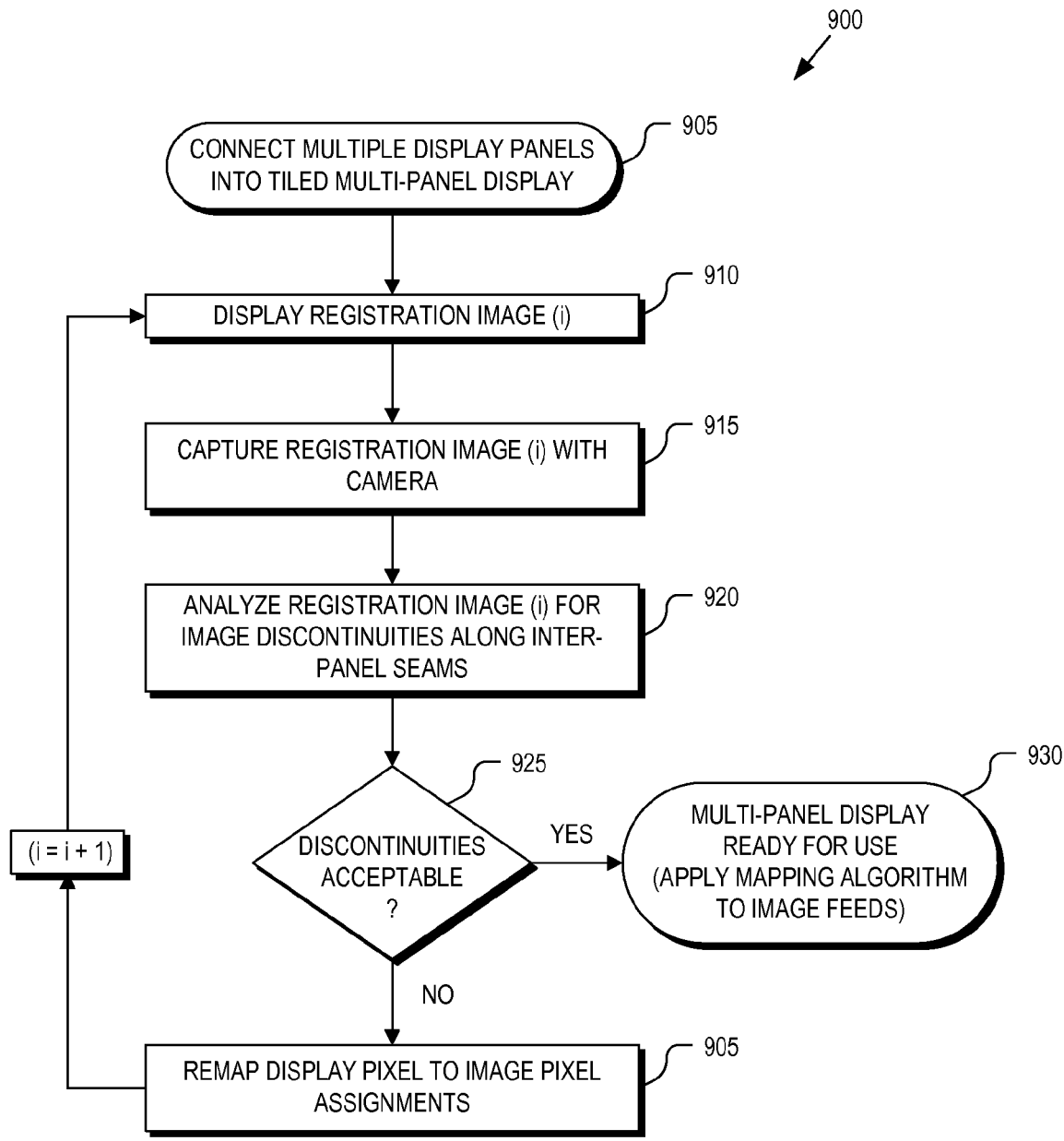
FIG. 9 illustrates a process for image registration to cure misalignments between connected display tiles of a multi-panel display, in accordance with an embodiment of the disclosure.

FIG. 9 illustrates a process 900 for image registration to cure misalignments between connected display tiles of a multi-panel display, in accordance with an embodiment of the disclosure. Process 900 is described with reference to FIG. 7A. The order in which some or all of the process blocks appear in process 900 should not be deemed limiting. Rather, one of ordinary skill in the art having the benefit of the present disclosure will understand that some of the process blocks may be executed in a variety of orders not illustrated, or even in parallel.

When coupling two or more display panels 700 together, perfect physical alignment may not be achieved, or the display panel may include intentionally randomized pixels that will not perfectly align due to the fiber slump over effect. Process 900 operates to identify misalignments or image discontinuities along the seams of a tiled multi-panel display (or within an interior region of the display panel) and remap display pixel to image pixel assignments to cure the defects.

In a process block 905, two or more display panels 700 are coupled together to form a tiled multi-panel display 701. As previously stated, this coupling may result in one or more image discontinuities along the inter-panel seams. To cure these defects, image engine 715 generates an initial registration image i (e.g., i=1) for transmission to display panels 700.

In one embodiment, registration image i is an alternating high contrast image (e.g., black and white checkerboard image) that provides several identifiable marks along the seam edges of each display panel 700 or displays a full screen image that provides enough information to recover the full position and orientation of each panel relative to one another.

In a process block 915, camera 710 is used to capture registration image i output from multi-panel display 701. The captured registration image i is then analyzed by registration logic 720 to identify any misalignment between panels (process block 920). If the misalignment is determined to be unacceptable (decision block 925), then registration logic 720 adjusts the display pixel to image pixel mapping in an attempt to cure the discontinuities or at least reduce the number of image discontinuities. With the pixel assignments remapped, process 900 loops back to process block 910 and may iterate by redisplaying a revised registration image i. The registration iterations may continue until the alignment is determined to be within acceptable limits (decision block 925), at which time multi-panel display 701 is ready for use. Alternatively, this software alignment may be computed from a single calibration image. The remapped display pixel to image pixel assignments are maintained and used for all image feeds until the next recalibration cycle.

In some embodiments, the image registration technique described in connection with FIG. 9 may further be used to smooth out other image discontinuities between the tiled panels than just physical misalignment of the display panels and their fibers. For example, the image registration technique may be used to adjust brightness, color temperature, etc. between the display panels to achieve uniform image characteristics and avoid perceived image characteristic boundaries between the tiled panels. Feedback from the displayed registration images can be used to adjust and smooth these differences. The image registration technique can even be used to smooth differences between individual pixels within a given display panel, if the underlying display permits such pixel-to-pixel adjustments. Of course, the inherent fiber entanglement due to random fiber slump over helps effectively blur these image discontinuities and further smooth the overall perceived picture uniformity—both inter and intra panel—since abrupt "seams" are inherently randomized.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A display panel for use with a multi-panel display, the display panel comprising:
   an array of display pixels to emit pixel light; and
   a fiber bundle including an array of fibers disposed over the array of display pixels, the fiber bundle including:
      a first end of the array of fibers rigidly fixed adjacent to the array of display pixels and optically aligned with the array of display pixels;
      a fused fiber portion having a rigid structure at the first end of the array of fibers; and
      a loose fiber portion that permits a second end of the array of fibers opposite the first end to slump-over and move, wherein the loose fiber portion is long enough such that the slump-over causes the array of fibers to intermesh at the second end,
   wherein the fiber bundle receives the pixel light emitted from the array of display pixels into the first end of the array of fibers and emits the pixel light out the second end of the array of fibers.

2. The display panel of claim 1, wherein the array of display pixels is disposed within a display substrate, the display panel further comprising:
   a bezel disposed around the array of display pixels as a trim that surrounds a periphery of the display substrate,
   wherein the loose fiber portion is long enough to cause slump-over of the second end of the fibers disposed along a perimeter side of the fiber bundle that conceals the bezel disposed along the perimeter side when the perimeter side is mated to another display panel of the multi-panel display.

3. The display panel of claim 1, wherein the fused fiber portion includes:
   micro lenses disposed into a bottom side of the fiber bundle that faces the array of display pixels, wherein each of the micro lenses is aligned with a corresponding fiber of the array of fibers.

4. The display panel of claim 1, wherein the fused fiber portion includes:
   cross-talk trenches disposed in a bottom side of the fiber bundle, the cross-talk trenches running between adjacent fibers of the array of fibers; and
   opaque material disposed within the cross-talk trenches to block stray light and reduce optical cross-talk between the adjacent fibers.

5. The display panel of claim 1, wherein the first end of the array of fibers is optically aligned on a one-to-one basis with the array of display pixels.

6. The display panel of claim 1, further comprising interconnecting optics disposed between the first end of the array of fibers and the array of display pixels, the interconnecting optics including:
   a circular polarizing layer,
   wherein the array of display pixels comprises a liquid crystal display ("LCD") panel that rotates a polarization of ambient light incident on the LCD panel by 180 degrees, wherein a combination of the circular polarizer and the LCD panel reduces reflections of the ambient light.

7. The display panel of claim 1, further comprising interconnecting optics disposed between the first end of the array of fibers and the array of display pixels, the interconnecting optics including:
an array of micro lenses to focus the pixel light emitted from the array of display pixels into the first end of the array of fibers; and
an anti-reflective coating.

8. The display panel of claim 1, wherein the second end of each of the fibers includes a divergence lens to increase a divergence of the pixel light emitted from the second end of the array of fibers.

9. The display panel of claim 8, wherein the divergence lens comprises one of a curved end surface or a graded-index lens formed in the second end of each of the fibers.

10. The display panel of claim 1, further comprising dark paint coated on exterior side surfaces of the loose fiber portion of the array of fibers to increase an image contrast of the display panel.

11. At least one machine-accessible storage medium that provides instructions that, when executed by one or more machines, will cause the one or more machines to perform operations comprising:
providing a registration image to a multi-panel fiber optic carpet display, wherein the registration image extends across multiple panels of the multi-panel fiber optic carpet display, wherein loose fiber portions of the multi-panel fiber optic carpet display are long enough to slump-over causing optic fibers to intermesh and conceal seams between the multiple panels;
capturing the registration image as emitted from the multi-panel fiber optic carpet display as a captured registration image;
analyzing the captured registration image for image discontinuities due to randomized positions of loose fiber ends that slump over; and
remapping display pixel to image pixel assignments of the multi-panel fiber optic carpet display to correct the image discontinuities.

12. The at least one machine-accessible storage medium of claim 11, wherein the slump over conceals bezels disposed around two adjacent image panels of the multi-panel fiber optic carpet display and the image discontinuities include misalignments occurring along a seam between the two bezels.

13. The at least one machine-accessible storage medium of claim 12, further providing instructions that, when executed by the machine, will cause the machine to perform further operations, comprising:
iterating the providing, the capturing, the analyzing, and the remapping until the misalignments are deemed to be acceptable.

14. The at least one machine-accessible storage medium of claim 11, wherein providing the registration image to the multi-panel fiber optic carpet display comprises providing the registration image via a cell phone and wherein the capturing the registration image as emitted from the multi-panel fiber optic carpet display comprises capturing the registration image with a camera integrated on the cell phone.

15. The at least one machine-accessible storage medium of claim 11, wherein each panel of the multi-panel fiber optic carpet display comprises:
a fiber bundle including an array of fibers disposed over an array of display pixels, the fiber bundle including a first end rigidly fixed adjacent to the array of display pixels and a loose fiber portion that permits a second end of the array of fibers opposite the first end to slump-over and move.

16. The at least one machine-accessible storage medium of claim 11, further providing instructions that, when executed by the machine, will cause the machine to perform further operations, comprising:
analyzing the captured registration image for discontinuities of an image characteristic other than physical placement of the loose fiber ends; and
adjusting the image characteristic on either a per display panel basis or a per pixel basis to increase uniformity of the image characteristic.

17. A multi-panel fiber optic carpet display, comprising:
a plurality of display panels mated to each other along a seam, each of the display panels including:
an array of display pixels to emit pixel light; and
a fiber bundle including an array of fibers disposed over the array of display pixels, the fiber bundle including:
a first end of the array of fibers rigidly fixed adjacent to the array of display pixels and optically aligned with the array of display pixels;
a fused fiber portion having a rigid structure at the first end of the array of fibers; and
a loose fiber portion that permits a second end of the array of fibers opposite the first end to slump-over and move, wherein the fiber bundle receives the pixel light emitted from the array of display pixels into the first end of the array of fibers and emits the pixel light out the second end of the array of fibers, wherein the loose fiber portion is long enough such that the slump-over causes the array of fibers to intermesh at the second end; and
a bezel disposed around the array of display pixels as a trim that surrounds a periphery of the display substrate,
wherein peripheral fibers disposed along either side of the seam between mated display panels slump over and conceal the bezel of each of the display panels at the seam.

18. The multi-panel fiber optic carpet display of claim 17, wherein the fused fiber portion includes:
micro lenses disposed into a bottom side of the fiber bundle that faces the array of display pixels, wherein each of the micro lenses is aligned with a corresponding fiber of the array of fibers.

19. The multi-panel fiber optic carpet display of claim 17, wherein the fused fiber portion includes:
cross-talk trenches disposed in a bottom side of the fiber bundle, the cross-talk trenches running between adjacent fibers of the array of fibers; and
opaque material disposed within the cross-talk trenches to block stray light and reduce optical cross-talk between the adjacent fibers.

20. The multi-panel fiber optic carpet display of claim 17, wherein the first end of the array of fibers is optically aligned on a one-to-one basis with the array of display pixels.

21. The multi-panel fiber optic carpet display of claim 17, wherein the second end of each of the fibers includes a divergence lens to increase a divergence of the pixel light emitted from the second end of the array of fibers.

* * * * *